(12) United States Patent
Tai et al.

(10) Patent No.: US 11,670,695 B2
(45) Date of Patent: Jun. 6, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Ming-Chia Tai, Zhubei (TW); Ju-Yuan Tzeng, Taipei (TW); Hsin-Che Chiang, Taipei (TW); Yuan-Sheng Huang, Taichung (TW); Chun-Sheng Liang, Puyan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 230 days.

(21) Appl. No.: 17/232,644

(22) Filed: Apr. 16, 2021

(65) Prior Publication Data

US 2021/0234013 A1    Jul. 29, 2021

Related U.S. Application Data

(63) Continuation of application No. 16/050,904, filed on Jul. 31, 2018, now Pat. No. 10,991,805.

(51) Int. Cl.
*H01L 29/417* (2006.01)
*H01L 29/66* (2006.01)
*H01L 21/3065* (2006.01)
*H01L 27/088* (2006.01)
*H01L 21/8234* (2006.01)
*H01L 29/78* (2006.01)

(52) U.S. Cl.
CPC .... *H01L 29/41791* (2013.01); *H01L 21/3065* (2013.01); *H01L 21/823431* (2013.01); *H01L 27/0886* (2013.01); *H01L 29/66795* (2013.01); *H01L 29/785* (2013.01)

(58) Field of Classification Search
CPC .................................................. H01L 29/417
See application file for complete search history.

(56) References Cited

U.S. PATENT DOCUMENTS 10,026,838 B2    7/2018   Wu et al.
2008/0182382 A1  7/2008   Ingle et al.

FOREIGN PATENT DOCUMENTS

TW          201731111 A      9/2017

*Primary Examiner* — Marvin Payen
(74) *Attorney, Agent, or Firm* — Slater Matsil, LLP

(57) ABSTRACT

A method of applying and then removing a protective layer over a portion of a gate stack is provided. The protective layer is deposited and then a plasma precursor is separated into components. Neutral radicals are then utilized in order to remove the protective layer. In some embodiments the removal also forms a protective by-product which helps to protect underlying layers from damage during the etching process.

20 Claims, 14 Drawing Sheets

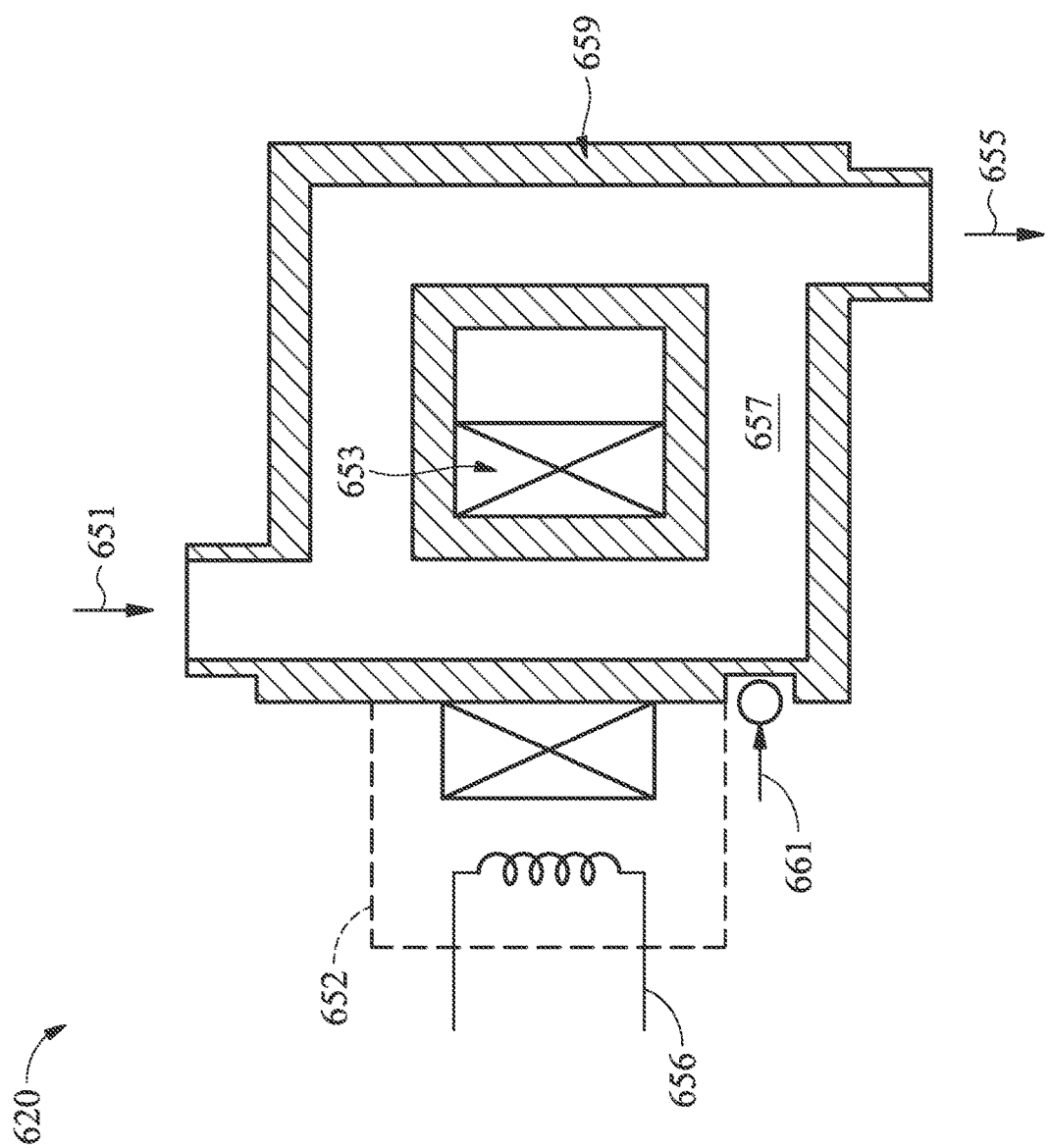

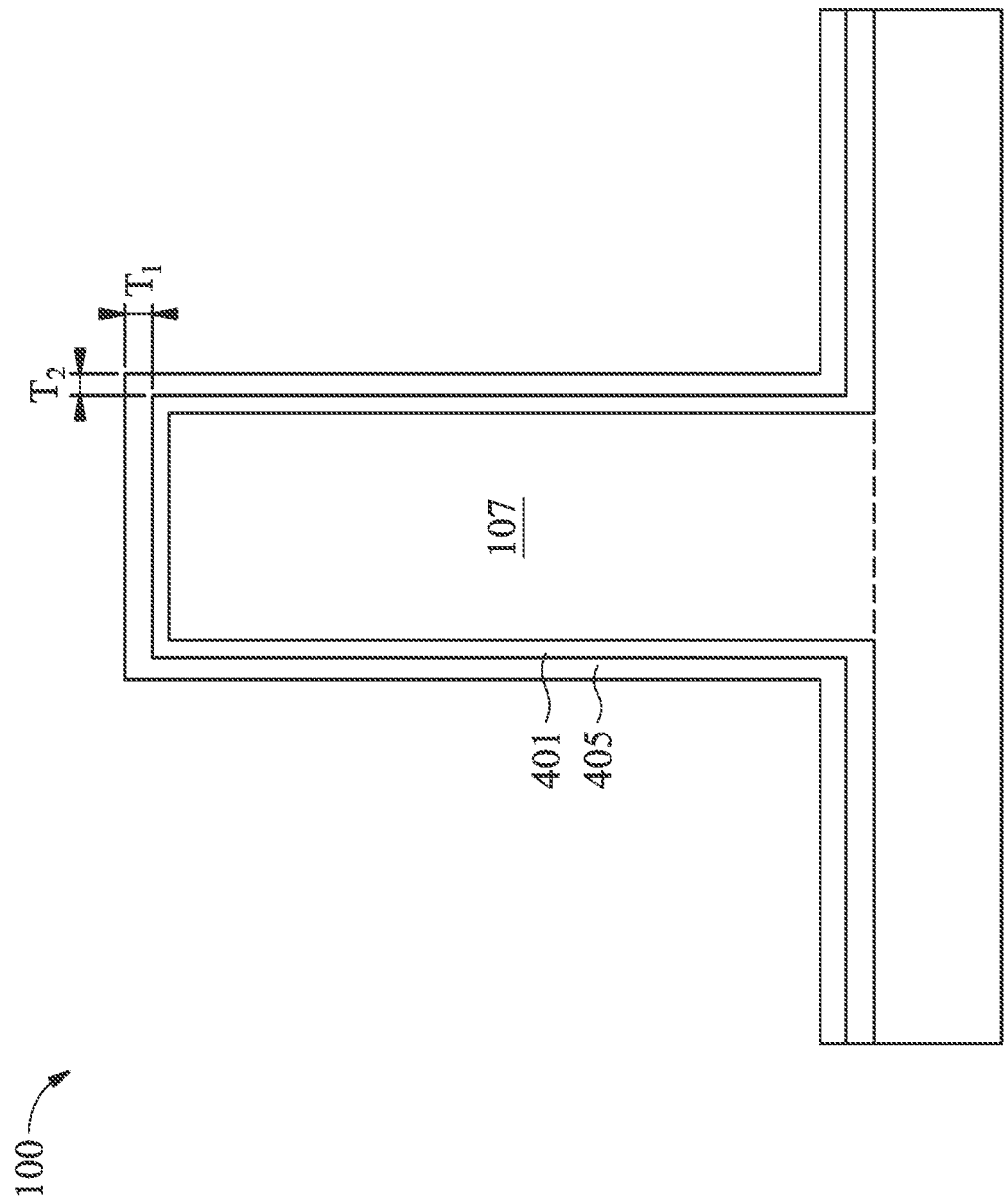

SEMICONDUCTOR DEVICE AND METHOD OF MANUFACTURE

PRIORITY CLAIM AND CROSS-REFERENCE

This application is a continuation of U.S. patent application Ser. No. 16/050,904, filed on Jul. 31, 2018, entitled "Semiconductor Device and Method of Manufacture," now U.S. Pat. No. 10,991,805 issued Apr. 27, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6C illustrate a first etching process in accordance with some embodiments.

FIGS. 7A-7C illustrate a second etching process in accordance with some embodiments.

DETAILED DESCRIPTION

Figure 1:
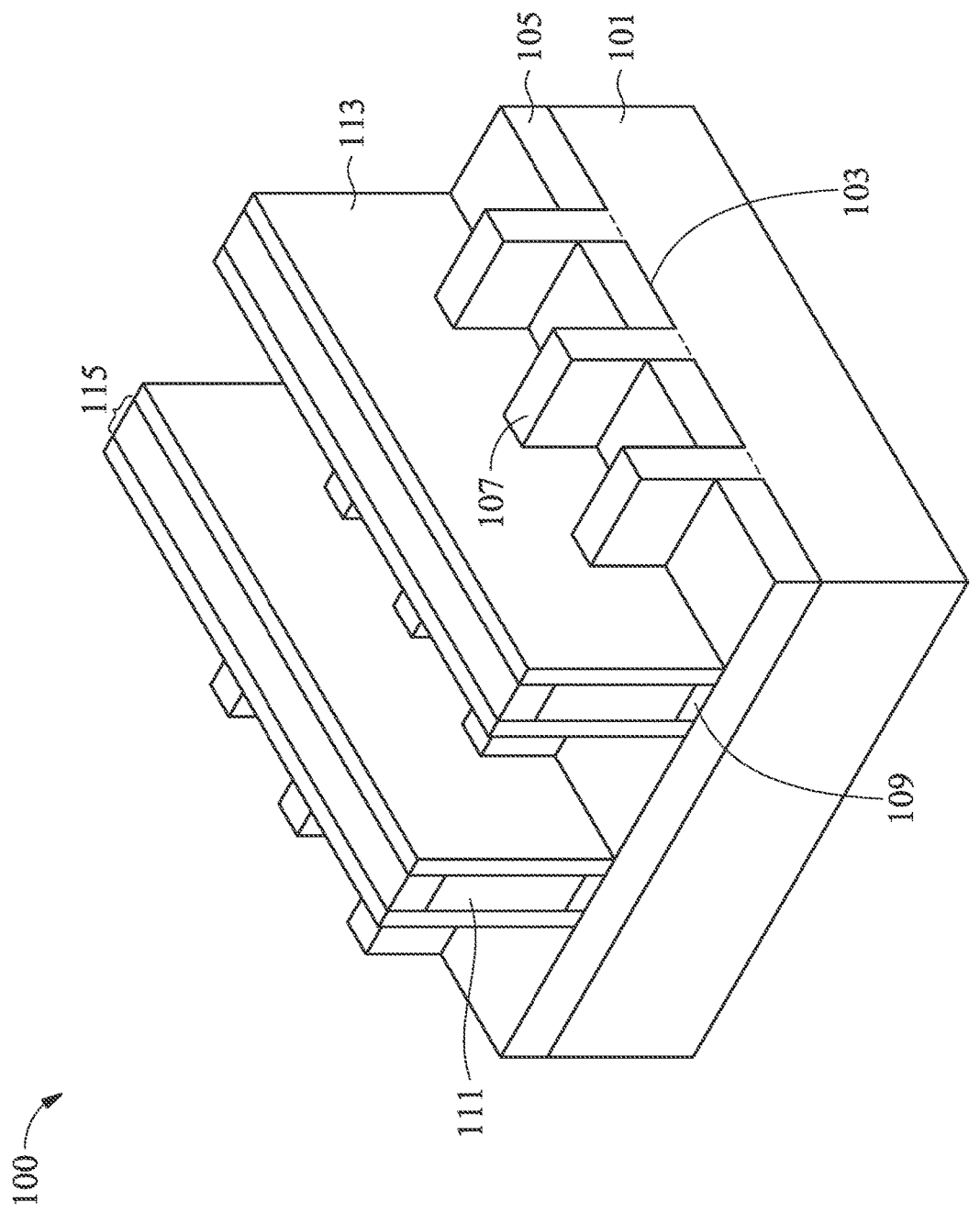
FIG. 1 illustrates a perspective view of a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described below with respect to specific embodiments, including protective thin films and methods for preventing surface damage of a 3D structure during formation of FinFET devices. Embodiments, however, are not intended to be limited, and may be utilized in a wide variety of embodiments beyond the formation of FinFET devices.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOL and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 may be formed, for example, by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
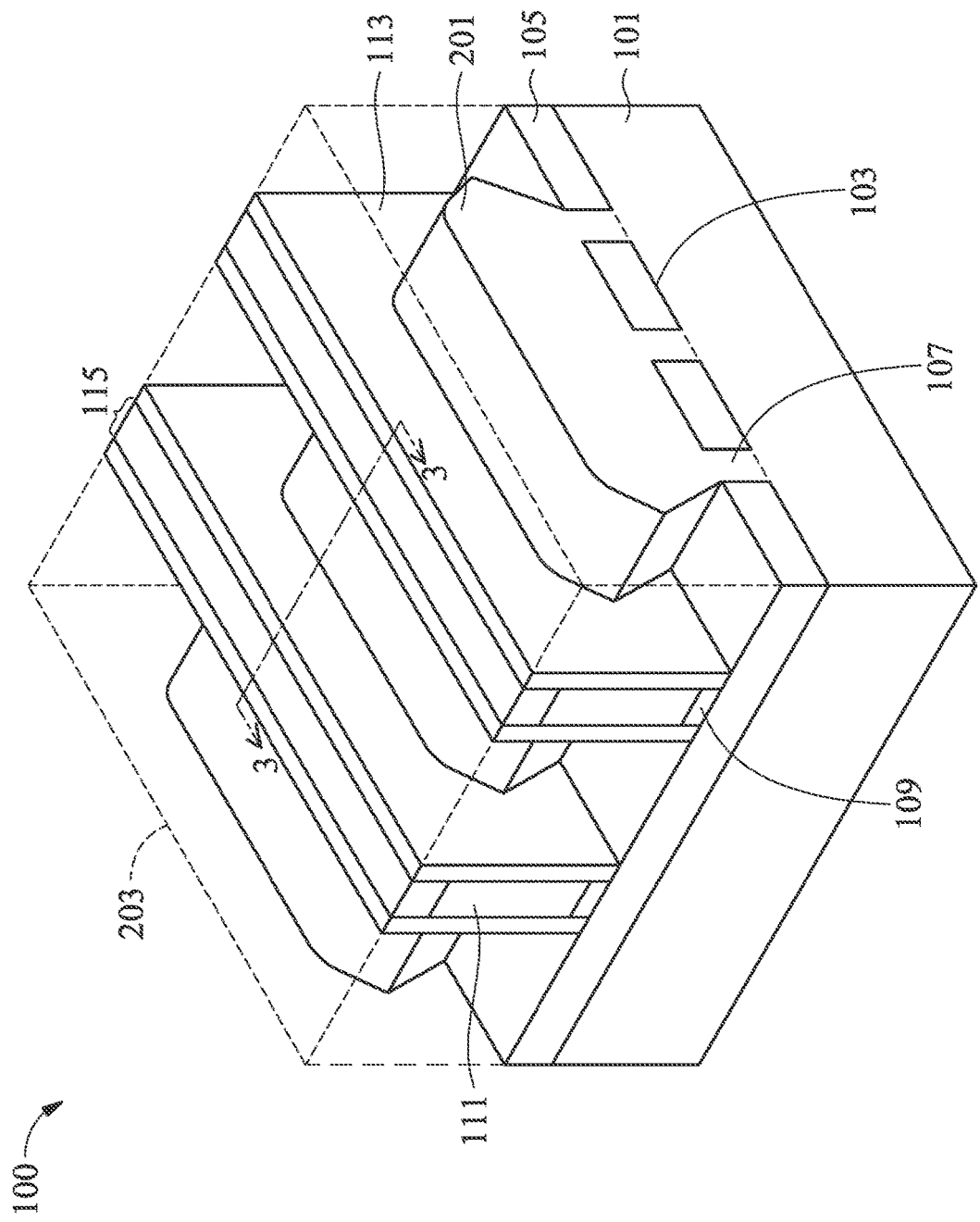
FIG. 2 illustrates formation of source/drain regions in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. In another embodiment, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may also be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3:
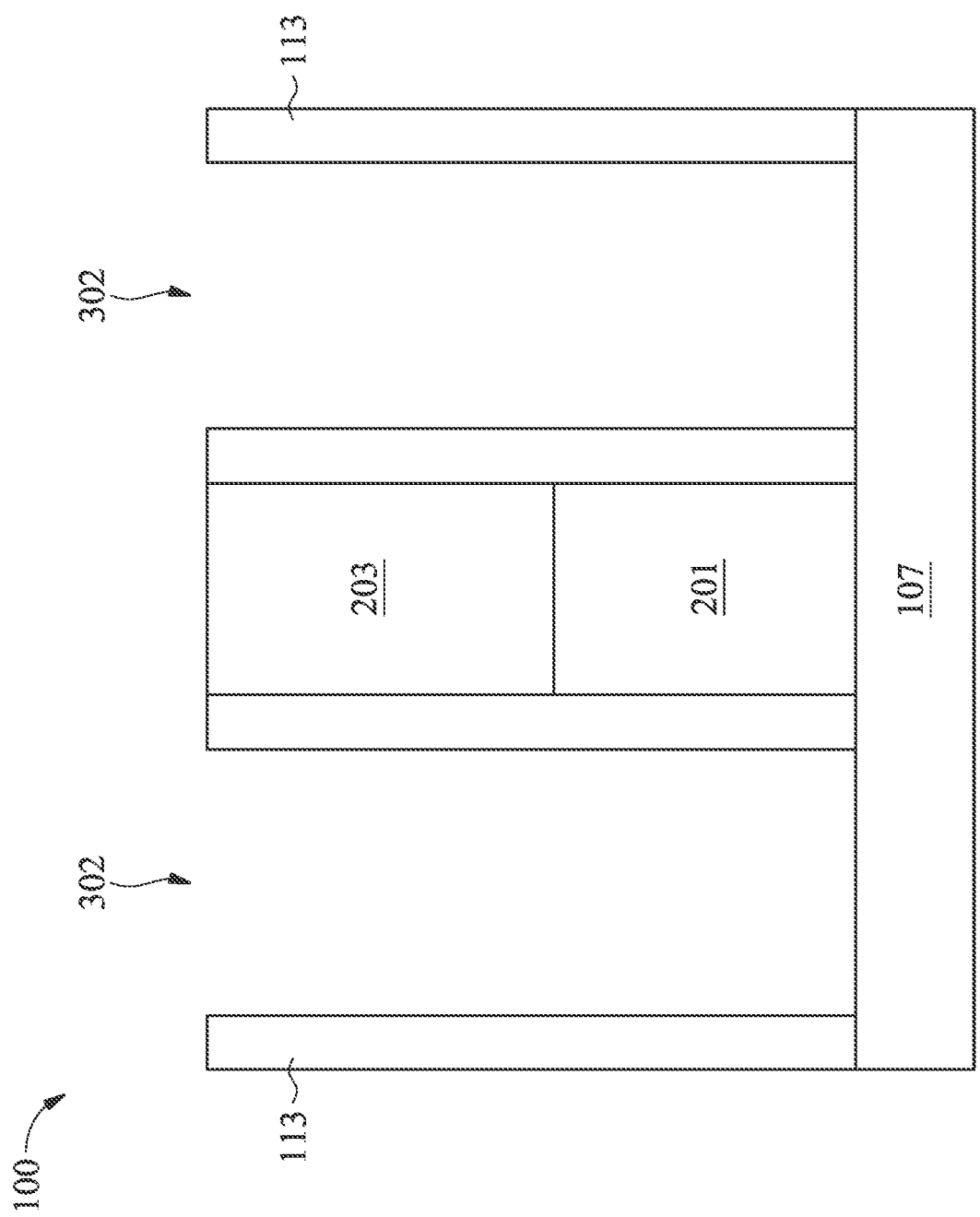
FIG. 3 illustrates a removal of a dummy gate electrode in accordance with some embodiments.

FIG. 3 illustrates a cross-sectional view of FIG. 2 along line 3-3' and also illustrates a removal of the material of the dummy gate electrode 111 and the dummy gate dielectric 109 forming openings 302 exposing the channel regions of fins 107. In an embodiment the dummy gate electrode 111 and the dummy gate dielectric 109 may be removed using, e.g., wet or dry etching processes that utilizes etchants that are selective to the material of the dummy gate electrode 111 and the dummy gate dielectric 109. In one embodiment the dummy gate electrode 111 may be removed using a wet etchant such as dilute hydrofluoric acid and hydrogen peroxide. However, any suitable removal process may be utilized. The exposed channel regions are illustrated in FIG. 3 with portions of the fins 107 embedded in first spacers 113 and source/drain regions 201.

Figure 4:
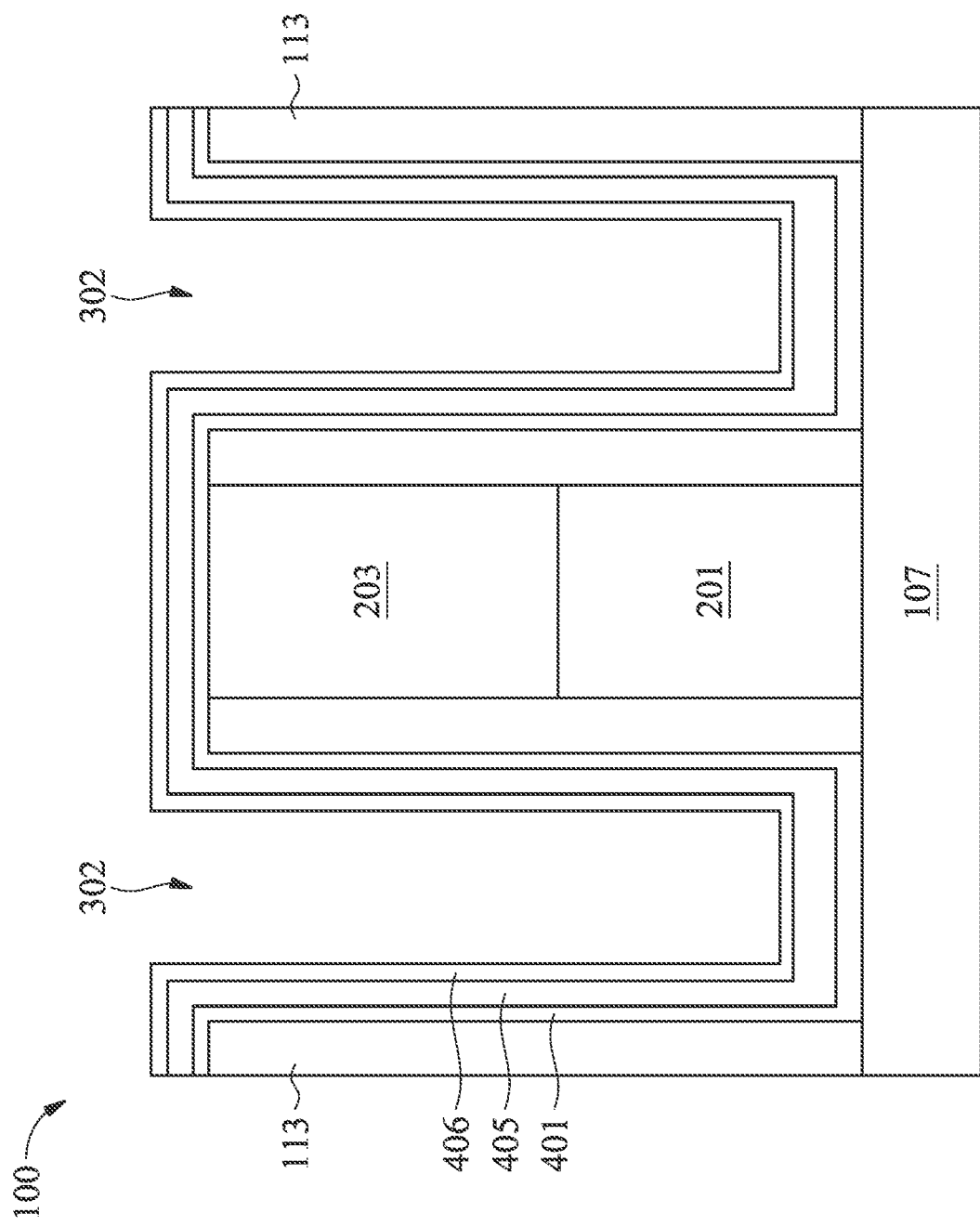
FIG. 4 illustrates a deposition of a gate dielectric, a barrier layer, and a protective layer in accordance with some embodiments.

FIG. 4 illustrates an intermediate step of forming a metal gate electrode in the openings 302 shown in FIG. 3. After the channel regions of the fins 107 have been exposed, a first dielectric material 401 may be deposited over the complex surfaces of the 3D structure within openings 302. In addition and also shown in FIG. 4, the first dielectric material 401 may be deposited over the planarized surfaces of the first spacers 113 and the ILD layer 203 in the source/drain regions 201 of the fins 107.

The first dielectric material 401 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. However, any other suitable materials, such as silicon oxynitride, may also be utilized. The first dielectric material 401 may be deposited to a thickness of between about 5 Å and about 200 Å, although any suitable thickness may be utilized.

Optionally, an interfacial layer (not separately illustrated in FIG. 4) may be formed prior to the formation of the first dielectric material 401. In an embodiment the interfacial layer may be a material such as silicon dioxide formed through a process such as in situ steam generation (ISSG). However, any suitable material or process of formation may be utilized.

Also optional, a first conductive layer (not separately illustrated in FIG. 4) may be formed on the first dielectric material 401. The first conductive layer may be a metal silicide material such as titanium silicon nitride (TSN). In an embodiment the first conductive layer may be formed using a deposition process such as chemical vapor deposition, although any suitable method of deposition, such as a deposition and subsequent silicidation, may be utilized to a thickness of between about 5 Å and about 30 Å. However, any suitable thickness may be utilized.

As illustrated in FIG. 4, a first metal material layer 405 may be formed adjacent to the first dielectric material 401 as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material layer 405 may be deposited using a deposition process such as atomic layer deposition, chemical vapor deposition, sputtering, or the like, to a thickness of between about 5 Å and about 200 Å, although any suitable deposition process or appropriate thickness may be used.

Once the first metal material layer 405 has been formed to the appropriate thickness, a protection layer 406 is deposited on the first metal material layer 405. The protection layer 406 may be a semiconductor material such as a silicon material (e.g., Si), although any suitable protective material may be utilized. The protection layer 406 may be formed to a thickness of between about 5 Å and 100 Å, such as about 15 Å. However, any appropriate thickness may be utilized.

The material properties of the protection layer 406 and the methods of deposition as described herein, allow for the protection layer 406 to provide good coverage and for good gap-fill. Additionally, the protection layer 406 helps to repair weaknesses that may form in portions of the first metal material layer 405 and first dielectric material 401 during anneal and etching of the 3D structure. For example, weaknesses formed in the first metal material layer 405 and/or first dielectric material 401 at the bottom of the openings 302 during etching of the 3D structure can lead to metal gate extrusion (MGEX). Other weaknesses formed at the planarized surface of the ILD layer 203 in the source/drain regions 201 of the fins 107 may lead to fin top damage during etching of the 3D structure. These weaknesses may result in manufacturing defects including substandard breakdown voltages of the semiconductor device.

These undesirable weaknesses may be repaired or even prevented by using the protection layer 406 as a protective layer on the first metal material layer 405 during subsequent anneal and etching processing of the 3D structure. By repairing and/or preventing these weaknesses, fewer defective parts may be manufactured, leading to an increase in overall yield.

The protection layer 406 may be formed through any of a variety of deposition techniques, including chemical vapor deposition (CVD), LPCVD (low-pressure chemical vapor deposition), APCVD (atmospheric-pressure chemical vapor deposition), PECVD (plasma-enhanced chemical vapor deposition), physical vapor deposition (PVD), plasma-enhanced atomic layer deposition (PE-ALD), sputtering, combinations of these, or the like. In one embodiment, the protection layer 406 is deposited conformally over the 3D structure using a deposition process such as CVD. In this embodiment, the deposition process may be performed at a process temperature of between about 300° C. and about 550° C., at a pressure of from about 0.1 torr to about 10 torr, for from about 1 second to about 180 minutes. However, any suitable deposition process, fitting temperature, or appropriate pressure may be used to form the protection layer 406.

Figure 5:
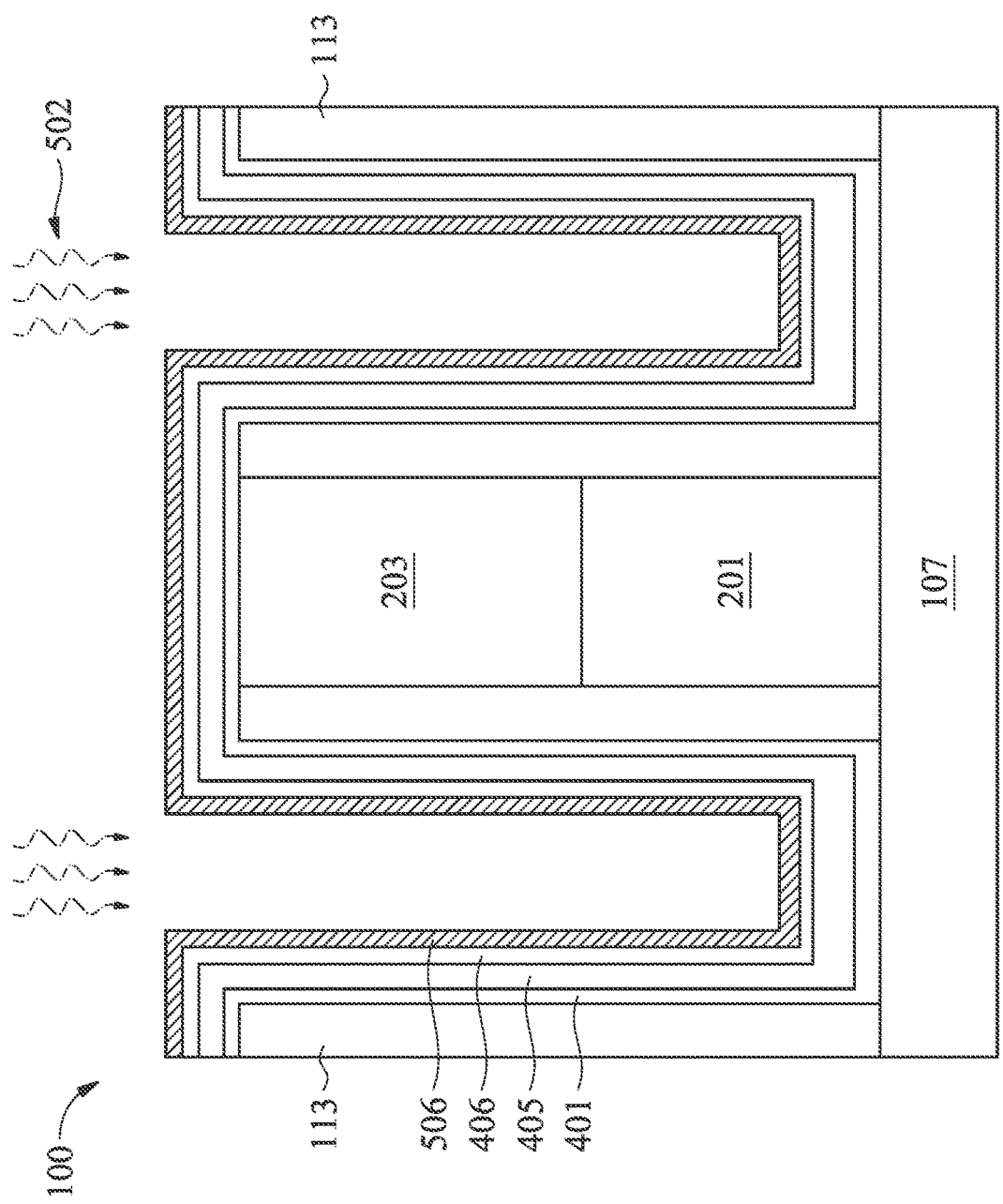
FIG. 5 illustrates an annealing process in accordance with some embodiments.

Turning to FIG. 5, after the protection layer 406 has been deposited, an anneal process 502 is performed for the first dielectric material 401. During the anneal process 502, the semiconductor device 100 is exposed to an oxygen rich environment such that a portion of the protection layer 406 becomes infused with oxygen forming oxide bonds with the material of the protection layer 406 and modifying a portion of the protection layer 406 into an oxide layer 506. In an embodiment, the protection layer 406 may be formed of a silicon (Si) material and the oxide layer 506 may be a silicon oxide ($SiO_2$) material.

In an embodiment the anneal process 502 may be performed at a temperature of between about 400 C and about 1300 C, such as about 900 C, for a time period of between about 0.01 sec and about 100 sec, such as about 10 sec. Additionally, the anneal process 502 may be performed in an oxidizing ambient environment, such as an environment comprising, oxygen, ozone, water, combinations of these, or the like. However, any suitable process parameters and ambient conditions may be utilized.

During the anneal process 502 the oxygen within the ambient will react with the material of the protection layer 406 to form the oxide layer 506. In an embodiment, once the anneal process 502 has been completed, the oxide layer 506 may have a thickness of between about 2A and about 20A, such as about 15A, while the remaining portion of the protection layer 406 may have a thickness of between about 3A and about 80A, such as about 15A. However, any suitable dimension may be utilized.

Figure 6A:
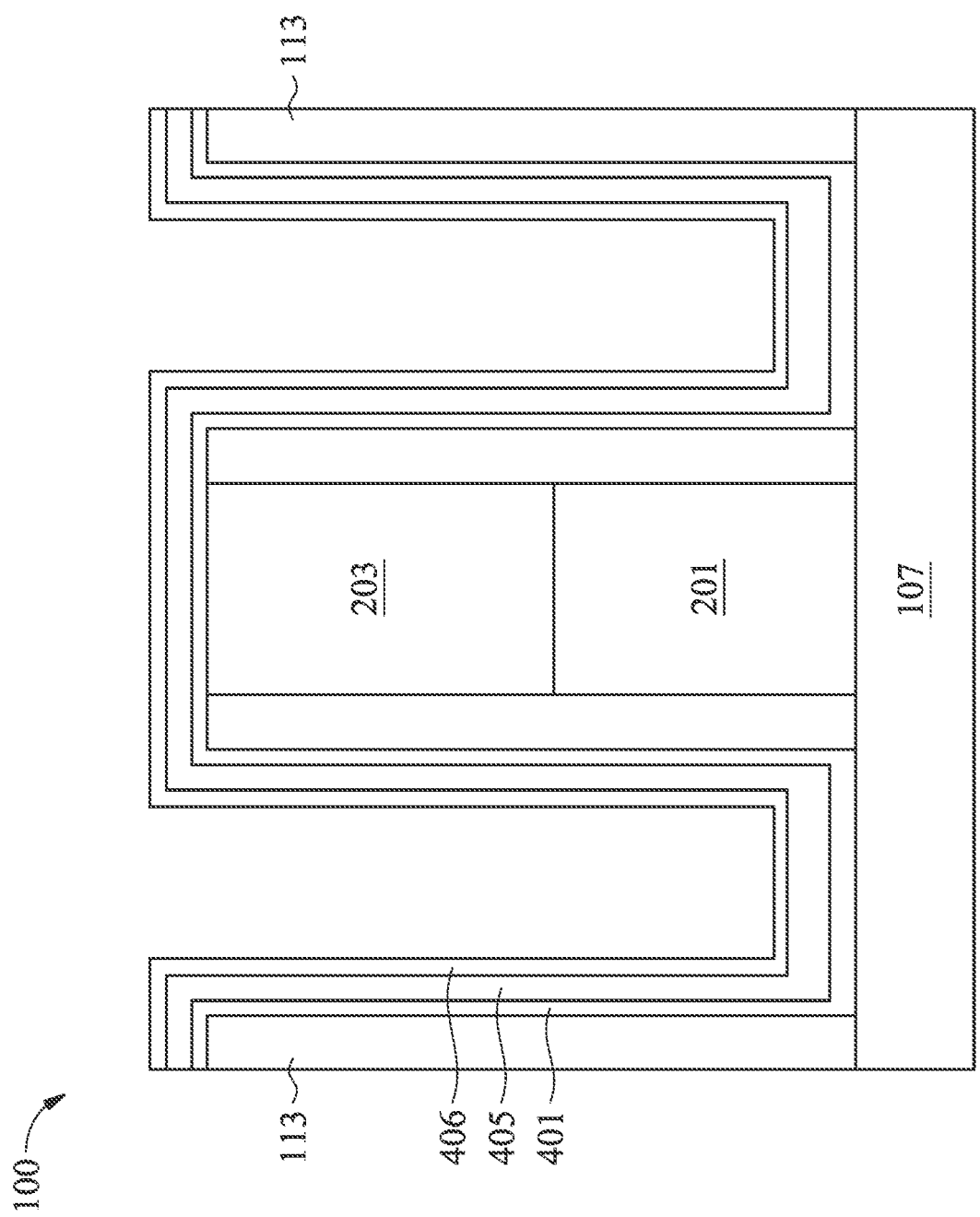

Continuing to FIG. 6A, once the anneal process 502 has completed, the oxide layer 506 portion of the protection layer 406 is removed. In an embodiment, the removal of the oxide layer 506 may be achieved via a plasma etch removal process. However, any suitable removal process may be used to remove the oxide layer 506.

Figure 6B:
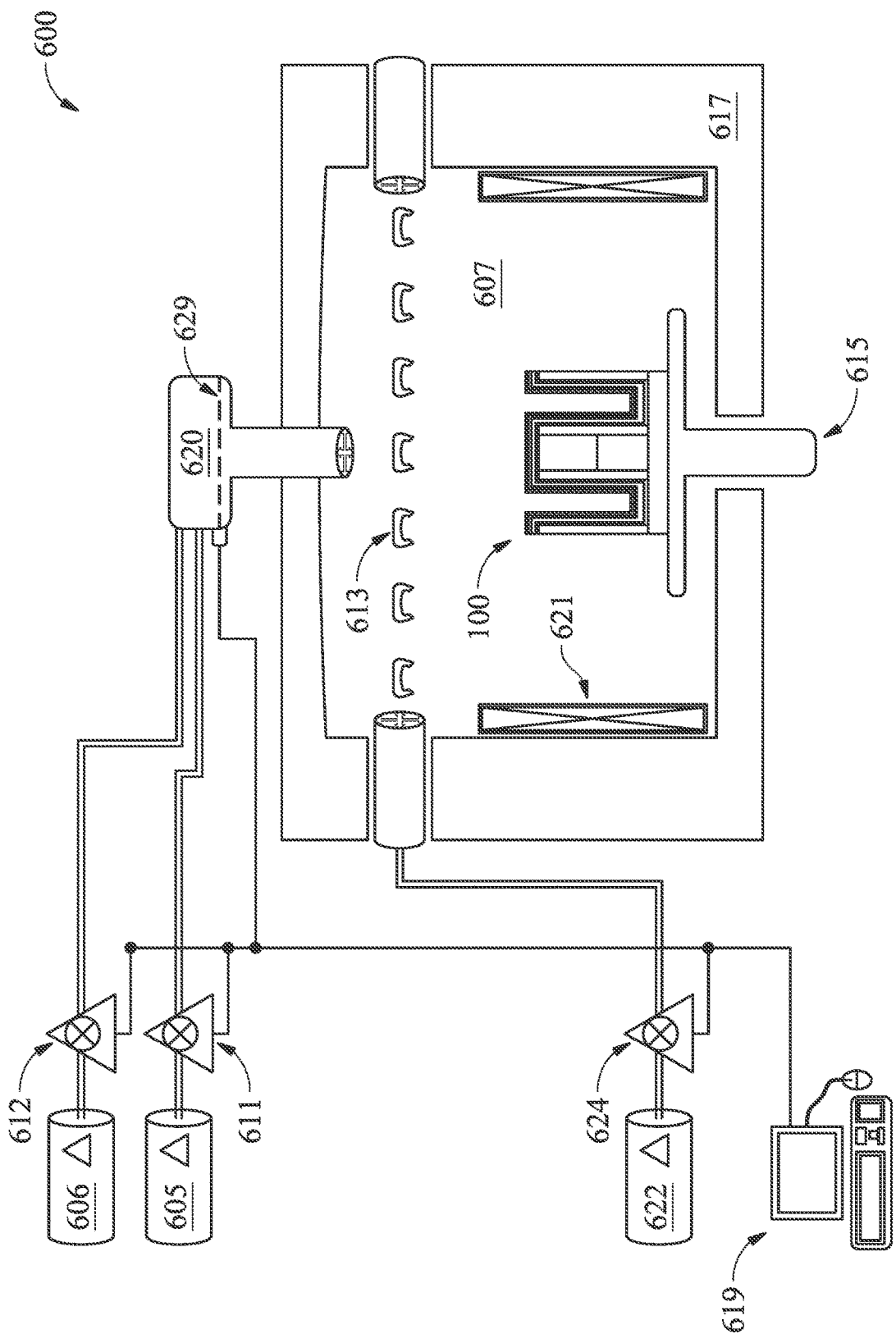

FIG. 6B illustrates a plasma etch removal process in an etching chamber 607 using remote plasma that may be utilized to remove the oxide layer 506 from the semiconductor device 100. However, while the embodiment is described with reference to the protection layer 406 for use in semiconductor manufacturing, the embodiments are not limited to a semiconductor manufacturing. Rather, any process that utilizes a plasma etch removal process may benefit from the embodiments. All such processes and plasma etchants are fully intended to be included within the scope of the embodiments.

In an embodiment the etching system 600 may utilize two or more precursor materials to remove the oxide layer 506. For example, the etching system 600 may receive precursor materials from a first precursor delivery system 605 and a second precursor delivery system 606 to generate an etchant used to remove the oxide layer 506 from the semiconductor device 100. The removal of the oxide layer 506 may be performed in the etching chamber 607 which receives the first precursor material and the second precursor material.

The first precursor delivery system 605 and the second precursor delivery system 606 may work in conjunction with one another to supply the various different precursor materials to the etching chamber 607. In an embodiment in which the first precursor material is in a gaseous state during preparation and storage (e.g., a first precursor material including nitrogen-trifluoride (e.g., ($NF_3$)), the first precursor delivery system 605 may comprise a first precursor material supplier, such as a gas storage tank or a machine to generate the first precursor material on an as-needed basis in order to supply it to the plasma block 620 (discussed further below).

In another embodiment where the first precursor material is either a liquid or solid precursor material, the first precursor delivery system 605 may comprise a carrier gas supply (not individually illustrated) and a precursor canister (also not individually illustrated) arranged in series. The carrier gas supply may be, e.g., an inert gas and may be used to help "carry" the precursor gas to the plasma block 620 and into the etching chamber 607 and may be coupled to the precursor canister, which may be utilized to supply a desired precursor (e.g., the first precursor material) to the etching chamber 607 by vaporizing or sublimating precursor materials that may be delivered in either a solid or liquid phase. The precursor canister may have a vapor region into which precursor material is driven into a gaseous phase so that the carrier gas may enter the precursor canister and pick-up or carry the gaseous precursor material out of the precursor canister and towards the etching chamber 607.

The first precursor delivery system 605 is connected to and supplies the first precursor material to a first precursor gas controller 611, which may supply the first precursor material to the plasma block 620 before the first precursor material enters the etching chamber 607. In an embodiment the first precursor gas controller 611 may include such devices as valves, flow meters, sensors, and the like to control the connection and delivery rate of the first precursor material to the plasma block 620. The first precursor gas controller 611 may be controlled and receive instructions from a control unit 619.

The second precursor delivery system 606 may comprise components similar to the first precursor delivery system 605. For example, if the second precursor material is in a gaseous state during preparation and storage (e.g., a second precursor material including a nitrogen and hydrogen containing compound such as ammonia ($NH_3$)), the second precursor delivery system 606 may comprise a second precursor material supplier, such as a gas storage tank or a machine to generate the second precursor material on an as-needed basis. In another embodiment, if the second precursor material is in a liquid or solid state during preparation and storage, the second precursor delivery system 606 may be implemented using a carrier gas and a sublimation/vaporization process.

The second precursor delivery system 606 is connected to and supplies the second precursor material to a second precursor gas controller 612, which may supply the second precursor material to the plasma block 620 before the second precursor material enters the etching chamber 607. In an embodiment the second precursor gas controller 612 may include such devices as valves, flow meters, sensors, and the like to control the connection and delivery rate of the second precursor material to the plasma block 620. The second precursor gas controller 612 receives instructions from and is controlled by the control unit 619.

The first precursor gas controller 611 and the second precursor gas controller 612, upon receiving instructions from the control unit 619, may open and/or close valves so as to connect the first precursor delivery system 605 and the second precursor delivery system 606 to the plasma block 620 and direct the desired precursor materials to their respective destinations. In an embodiment, the first precursor gas controller 611 and the second precursor gas controller 612 will respectfully direct the first precursor material and the second precursor material to the plasma block 620. For example, the first precursor gas controller 611 directs the first precursor material to a first inlet of the plasma block 620 and the second precursor gas controller 612 directs the second material to a second inlet of the plasma block 620.

Additionally, while a single plasma block 620 is illustrated in FIG. 6B, any number of plasma blocks 620 may additionally be included within the etching system 600 for separately processing the different precursor materials. For example, in some embodiments, the first precursor gas controller 611 directs the first precursor material to an inlet of a first plasma block of a plurality of plasma blocks 620 and the second precursor gas controller 612 directs the second precursor material to an inlet of a second plasma block (not separately shown) of the plurality of plasma blocks 620. In still another embodiment, the first precursor gas controller 611 directs the first precursor material to a mixer (not separately shown) and the second precursor gas controller 612 directs the second material to the mixer. According to instructions received from the control unit 619, the mixer combines appropriate amounts of the first precursor material with appropriate amounts of the second precursor material to form a desired mixture of the first precursor material and the second precursor material. The mixer provides the desired mixture to an inlet of the plasma block 620.

Once processed by the plasma block 620, a first precursor plasma of the first precursor material, a second precursor plasma of the second precursor material and/or a compound precursor plasma of the compound precursor material are provided, according to instructions of the control unit 619, to one or more plasma inlets of the showerhead 613. The showerhead 613 may be a multiple-zone showerhead utilized to disperse the chosen precursor materials into the etching chamber 607 and may be designed to evenly disperse the precursor materials in order to minimize undesired process conditions that may arise from uneven dispersal. In an embodiment in which two precursor materials are utilized the showerhead 613 may have a dual dispersion design that accepts both the first precursor plasma (through, e.g., a first plasma inlet) and the second precursor plasma (through, e.g., a second plasma inlet) at the same time and will disperse both the first precursor plasma and the second precursor plasma in an even distribution around the etching chamber 607. The showerhead 613 may have a circular design with openings dispersed evenly around the showerhead 613 to allow for the dispersal of the first precursor plasma and the second precursor plasma into the etching chamber 607.

The etching chamber 607 may receive the desired precursor materials and expose the precursor materials to the surfaces of the semiconductor device 100, and the etching chamber 607 may be any desired shape that may be suitable for dispersing the precursor materials and contacting the precursor materials with the semiconductor device 100. In the embodiment illustrated in FIG. 6B, the etching chamber 607 has a cylindrical sidewall and a bottom. Furthermore, the etching chamber 607 may be surrounded by a housing 617 made of material that is inert to the various process materials. In an embodiment, the housing 617 may be steel, stainless steel, nickel, aluminum, alloys of these, or combinations of these.

Within the etching chamber 607 the semiconductor device 100 may be placed on a mounting platform 615 made of, e.g., aluminum, in order to position and control the semiconductor device 100 during the etching process. The mounting platform 615 may be rotatable and may include heating mechanisms in order to heat the semiconductor device 100 during the etching process. Furthermore, while a single mounting platform 615 is illustrated in FIG. 6B, any number of mounting platforms 615 may additionally be included within the etching chamber 607.

The etching chamber 607 may also have pumping channels 621 for exhaust gases to exit the etching chamber 607. A vacuum pump (not shown) may be connected to the pumping channels 621 of the etching chamber 607 in order to help evacuate the exhaust gases. The vacuum pump, under control of the control unit 619, may also be utilized to reduce and control the pressure within the etching chamber 607 to a desired pressure and may also be utilized to evacuate precursor materials from the etching chamber 607 in preparation for the introduction of a purge gas.

FIG. 6C illustrates an embodiment of the plasma block 620 (or plasma generator) from FIG. 6B in greater detail. In an embodiment the plasma block 620 has an inlet port 651 that receives the first precursor material from the first precursor gas controller 611 and the second precursor material from the second precursor gas controller 612 and an outlet port 655 that is coupled to deliver a first precursor plasma (converted from the first precursor material) to the showerhead 613. The first precursor material enters the plasma block 620 and passes between a magnetic core 653 that surrounds a portion of the plasma block 620. The magnetic core 653 is utilized to induce the formation of the first precursor plasma from the first precursor material that enters the plasma block 620 before exiting out of the outlet port 655.

The magnetic core 653 may be situated around a portion of the flow path through the plasma block 620 from the inlet port 651 to the outlet port 655. In an embodiment the magnetic core 653 is one portion of a transformer 652 (illustrated in FIG. 6C with dashed line 652), with a primary coil 656 forming another portion of the transformer 652. In an embodiment the primary coil 656 may have a winding of between about 100 and about 1000 such as about 600.

To generate the desired first precursor plasma from the first precursor material and the desired second precursor plasma from the second precursor material within the plasma block 650, a short, high-voltage pulse of electricity controlled, e.g., by the control unit 619 (see FIG. 6B) may be applied to the primary coil 656. The high-voltage pulse of electricity in the primary coil 656 is transformed to a pulse of energy into the magnetic core 653, which induces the formation of the first precursor plasma and the second precursor plasma within the plasma block 620. In an embodiment the high-voltage pulse may be between about 10 kHz and about 30 MHz such as about 13.56 MHz, while the temperature is between about 50° C. and about 200° C. and with a pressure of between about 1 torr and about 20 torr.

However, while igniting the first precursor material and the second precursor material with a magnetic coil is described as one embodiment, other embodiments are not so limited. Rather, any suitable method or structures may be used to ignite the first precursor material to form the first precursor plasma and to ignite the second precursor material to form the second precursor plasma. For example, in other embodiments a high voltage pulse may be applied to an electrode (not illustrated) coupled to the plasma block 620, or the first precursor material and the second precursor material may be exposed to a ultraviolet radiation that may be used to ignite the first precursor material and the second precursor material and form the first precursor plasma and the second precursor plasma. Any suitable method of ignition and any other suitable plasma inducing device are fully intended to be included within the scope of the embodiments.

The plasma block 620 also comprises an inner housing 657 and an insulator 659 surrounding the inner housing 657. The insulator 659 may be used to electrically and thermally isolate the inner housing 657 of the plasma block 620. In an embodiment the inner housing 657 encloses and encapsulates the circular path of the first precursor material and the second precursor material and (after ignition) the first precursor plasma and the second precursor plasma in order to guide the first precursor material and the first precursor plasma through the plasma block 620.

The plasma block 620 may also comprise a sensor 661 that may be used to measure the conditions within the plasma block 620. In an embodiment the sensor 661 may be a current probe used to measure the current and power of the plasma as part of a feedback loop to the control unit 619 (see FIG. 6B). In addition, or in a separate embodiment, the sensor 661 may also comprise an optical sensor or any other measurement devices that may be used to measure and control the plasma generation within the plasma block 620.

Returning to FIG. 6B, the removal of the oxide layer 506 may be initiated by putting the first precursor into the first precursor delivery system 605. For example, in an embodiment the first precursor material may be a material that can work in conjunction with the second precursor material as a plasma to remove the material of the oxide layer 506. In one embodiment the first precursor material may be a compound which comprises fluorine, such as, for example, fluorine ($F_2$), sulfur hexafluoride ($SF_6$), carbon tetrafluoride ($CF_4$), nitrogen tri-fluoride ($NF_3$) or the like. However, any suitable etching precursor may be utilized for the first precursor material.

Additionally, the second precursor material may be placed into or formed by the second precursor delivery system 606. In an embodiment to form the plasma etchant, the second precursor material may be a material that can work in conjunction with the first precursor material as a plasma to remove the material of the oxide layer 506. In one embodiment the second precursor material may be a compound which comprises hydrogen, for example, hydrogen ($H_2$) or a combination of nitrogen ($N_2$) and hydrogen ($H_2$) gas, ammonia (NH3), or the like. However, any suitable etching precursor may be utilized for the second precursor material.

Once the first precursor material and the second precursor material are ready in the first precursor delivery system 605 and the second precursor delivery system 606, respectively, the formation of the plasma etchant may be initiated by the control unit 619 sending an instruction to the first precursor gas controller 611 and the second precursor gas controller 612 to connect the first precursor delivery system 605 and the second precursor delivery system 606 to the etching chamber 607 via the plasma block 620. Once connected, the first precursor delivery system 605 can deliver the first precursor material (e.g., $NF_3$) to the showerhead 613 through the plasma block 620, with the plasma block 620 inducing the formation of the first precursor plasma as the first precursor material passes through the plasma block 620. The showerhead 613 can then disperse the first precursor plasma into the etching chamber 607, wherein the first precursor plasma can be adsorbed and react on the exposed surfaces of the semiconductor device 100.

In an embodiment in which the first precursor material is $NF_3$, the first precursor material may be flowed into the plasma block 620 at a flow rate of between about 3 sccm and about 400 sccm, such as about 100 sccm. Additionally, once the first precursor material is turned into a plasma, the etching chamber 607 may be held at a pressure of between about 0.3 torr and about 10 torr, such as about 2 torr, and a temperature of between about 30° C. and about 150° C., such as about 100° C. However, as one of ordinary skill in the art will recognize, these process conditions are only intended to be illustrative, as any suitable process conditions may be utilized while remaining within the scope of the embodiments.

At the same time, the introduction of the second precursor material (e.g., $NH_3$) to the etching chamber 607 may be initiated by the control unit 619 sending an instruction to the second precursor gas controller 612 to connect the second precursor delivery system 606 (supplying the second precursor material) to the etching chamber 607 via the plasma block 620 (or, if desired, a separate plasma block 620). Once connected, the second precursor delivery system 606 can deliver the second precursor material (e.g., $NH_3$) to the showerhead 613 through the plasma block 620, with the plasma block 620 inducing the formation of the second precursor plasma as the second precursor material passes through the plasma block 620. The showerhead 613 can then disperse the second precursor plasma into the etching chamber 607, wherein the second precursor plasma can react with the first precursor plasma and the oxide material of the oxide layer 506 to remove the oxide layer 506.

In the embodiment in which the second precursor material is ammonia, the second precursor material may be flowed into the plasma block 620 at a flow rate of between about 20 sccm and about 400 sccm, such as about 100 sccm. However, as one of ordinary skill in the art will recognize, these process conditions are only intended to be illustrative, as any suitable process conditions may be utilized while remaining within the scope of the embodiments.

Figure 7A:
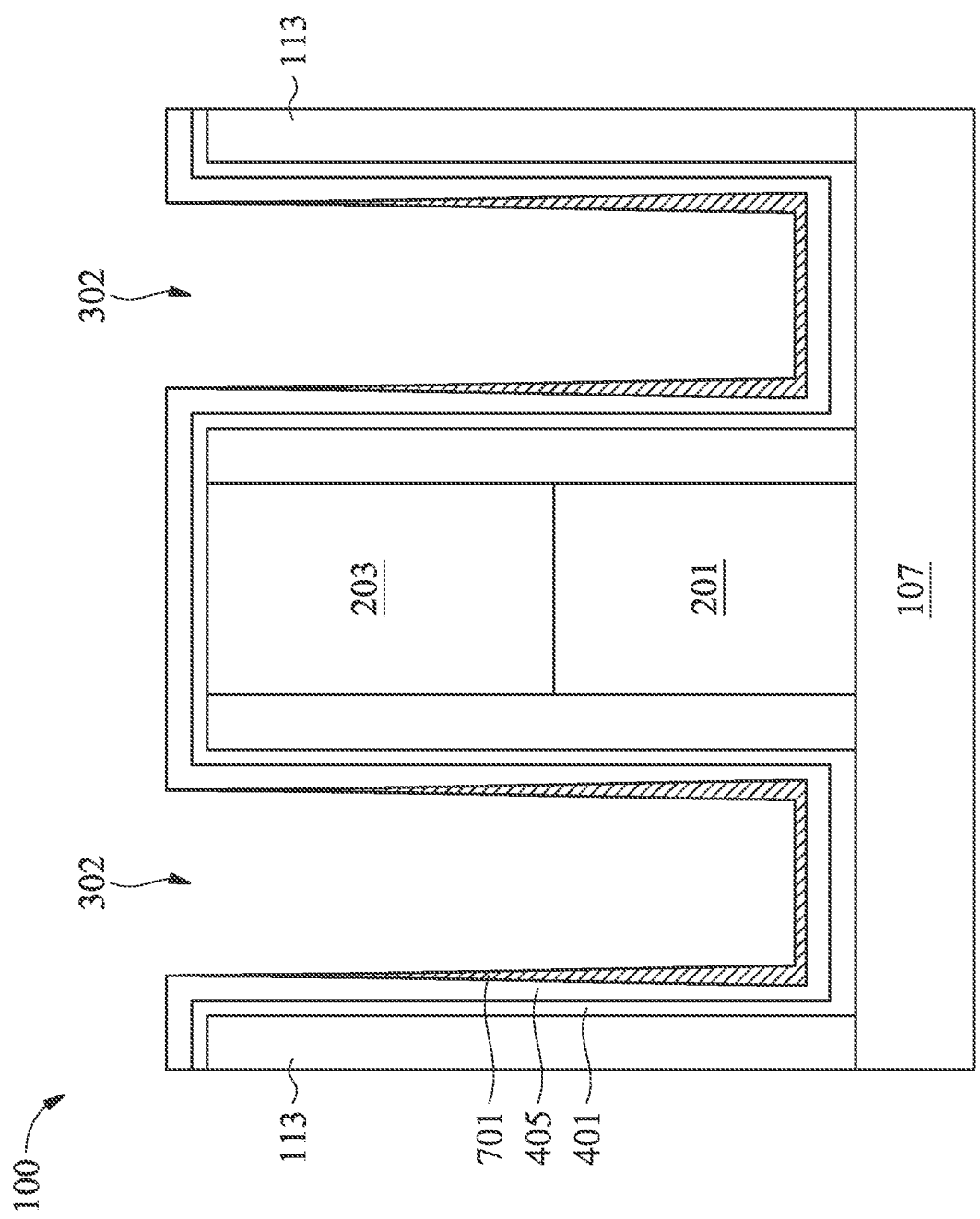

FIG. 7A illustrates that, once the oxide layer 506 portion of the protection layer 406 is removed, the remaining portion of the protection layer 406 may be removed. In an embodiment, the removal of the remaining portion of the protection layer 406 may be achieved via a radical plasma etch process. However, any suitable removal process may be used to remove the remaining portion of the protection layer 406.

During the radical plasma etch used to remove the remaining portion of the protection layer 406, a solid by-product material 701 may be formed on the surface of the semiconductor device 100, as shown in FIG. 7A. The solid by-product material 701 may prevent and/or repair damage to the first metal material layer 405 and/or may reinforce the integrity of the first metal material layer 405 in areas that become weakened during etching of the remaining portions of the protection layer 406 and is discussed in greater detail later.

Figure 7B:
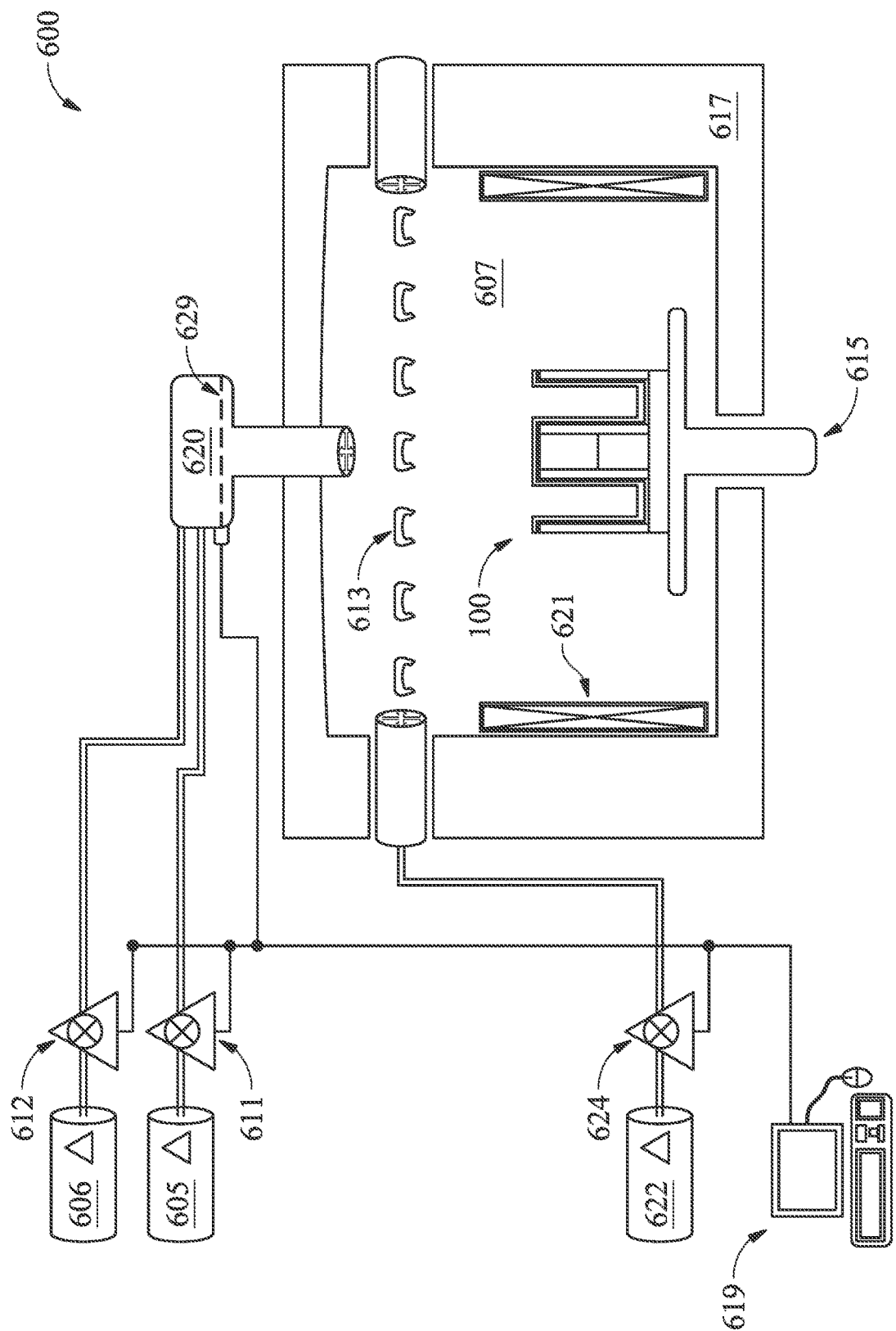

FIG. 7B illustrates the removal of the remaining portion of the protection layer 406 via the radical plasma etch removal process in an etching chamber 607 using a remote plasma to remove the remaining portion of the protection layer 406 from the surface of the semiconductor device 100. In an embodiment the radical plasma etch removal process may be performed in situ within the etching system 600 (described above with respect to FIG. 6B). In another embodiment the remaining portion of the protection layer 406 may be removed in a separate etching chamber that comprises similar structures as described for the etching system 600.

In an embodiment the etching system 600 for the radical plasma etch may utilize two or more precursor materials (e.g., the first precursor material and a third precursor material) to remove the remaining portion of the protection layer 406. For example, the etching system 600 may utilize precursor materials from the first precursor delivery system 605 and a third precursor delivery system 622 to generate an etchant used to remove the remaining portions of the protection layer 406 from the semiconductor device 100. The removal of the remaining portions of the protection layer 406 may be performed in the etching chamber 607 which receives radicals from the first precursor material and the third precursor material.

The first precursor delivery system 605 and the third precursor delivery system 622 may work in conjunction with one another to supply the various different precursor materials to the etching chamber 607. For example, the third precursor delivery system 622 may comprise components similar to the first precursor delivery system 605. For example, if the third precursor material is in a gaseous state during preparation and storage, the third precursor delivery system 622 may comprise a third precursor material supplier, such as a gas storage tank or a machine to generate the third precursor material on an as-needed basis. In another embodiment, if the third precursor material is in a liquid or solid state during preparation and storage, the third precursor delivery system 622 may be implemented using a carrier gas and a sublimation/vaporization process.

The third precursor delivery system 622 may supply a stream of the third precursor material to, e.g., a third precursor gas controller 624, which may supply the third precursor material to the showerhead 613 without turning it into a plasma as the third precursor material (in a non-plasma phase) enters the etching chamber 607. In an embodiment the third precursor gas controller 624 may be similar to the first precursor gas controller 611 (discussed above) and may include such devices as valves, flow meters, sensors, and the like to control the connection and delivery rate of the third precursor material to the showerhead 613. The third precursor gas controller 624 may also be controlled and receive instructions from the control unit 619.

The first precursor gas controller 611 and the third precursor gas controller 624, upon receiving instructions from the control unit 619, may open and/or close valves so as to connect the first precursor delivery system 605 to the plasma block 620 and connect the third precursor delivery system 622 to the etching chamber 607 and direct the desired precursor materials to their respective destinations. For example, the first precursor gas controller 611 will direct the first precursor material to the plasma block 620 and the third precursor gas controller 624 will direct the second precursor material to the showerhead 613.

The showerhead 613 may be a multiple-zone showerhead utilized to disperse the chosen precursor materials into the etching chamber 607 and may be designed to evenly disperse the precursor materials in order to minimize undesired process conditions that may arise from uneven dispersal. In an embodiment in which two precursor materials are utilized the showerhead 613 may have a dual dispersion design that accepts both the first precursor material (through, e.g., a first plasma inlet) and the third precursor material (through, e.g., a third inlet) at the same time and will disperse both the first precursor material and the third precursor material in an even distribution around the etching chamber 607. The showerhead 613 may have a circular design with openings dispersed evenly around the showerhead 613 to allow for the dispersal of the first precursor material and the third precursor material into the etching chamber 607.

In an embodiment the control unit 619 also controls the activation of a filter 629 disposed, for example, within the plasma block 620. In an embodiment the filter 629 is utilized in order to separate elements of the plasma formed from the precursor materials provided to the plasma block 620. In another embodiment, the filter 629 may be disposed within the etching chamber 607 between the inlet for the first precursor plasma and the mounting platform 615. Any suitable placement may be utilized.

In an embodiment the filter 629 may be an electrically charged grating that acts as a barrier to the movement of charged ions from the generated plasma while allowing uncharged, neutral plasma components (e.g., neutral radicals) to pass through the filter 629. In an embodiment the filter 629 can prevent the charged plasma ions (e.g., positively charged ions or negatively formed ions) from passing by either repelling the charged plasma ions or else by attracting the charged plasma ions. However, any suitable device that can separate radicals from a plasma may be utilized.

Once the first precursor plasma has been generated from the first precursor material, the first precursor plasma will comprise positive ions, negative ions, and neutral radical components disposed within the first precursor plasma. However, the filter 629 allows the neutral radical components to pass through the filter 629 and into the etching chamber 607 where the semiconductor device 100 is located. Additionally, the filter 629 prevents the movement of the positive ions and also the negative ions from entering the etching chamber 607. In effect, the filter 629 is utilized to filter the positive ions and the negative ions from the first precursor plasma, thereby allowing only or mainly the neutral radical components to be used.

To initiate the removal of the remainder of the protection layer 406, the control unit 619 sends a signal to the first precursor gas controller 611 to start a flow of the first precursor material (e.g., NF$_3$) to the plasma block 620 and also sends a signal to the third precursor gas controller 624 to start a flow of the third precursor material (e.g., H$_2$) to the showerhead 613. In an embodiment to remove the protection layer 406, the first precursor material may be flowed at a flow rate of between about 10 sccm and about, such as about 200 sccm, while the third precursor material may be flowed at a flow rate of between about 500 sccm and about 10000 sccm, such as about 5000 sccm. As such, the process may utilize a ratio of the first precursor material (e.g., NF$_3$) to the third precursor material (e.g., H$_2$) of between about 0.2% and about 1.1%, such as about 0.56%. However, any suitable flow rates and ratios may be utilized.

By sending the first precursor material to the plasma block 620, the first precursor material will be turned into the first precursor plasma while the third precursor material remains in its original form (e.g., not a plasma). Additionally, with the presence of the filter 629, the first precursor plasma will be separated into its individual components, and mainly or only the neutral radicals will enter the etching chamber 607. As such, the precursors that enter the etching chamber include the third precursor material and the neutral radicals from the plasma of the first precursor material.

Within the etching chamber, the third precursor material and the neutral radicals from the plasma of the first precursor material will react with the exposed surfaces of the protection layer 406 (e.g., silicon). The reaction can be performed at a pressure of less than about 5 Torr, such as less than about 2 Torr and a temperature of between about 30° C. and about 100° C., such as about 60° C. Additionally, the etching process to remove the remainder of the protection layer 406 may be performed for a time of between about 30 seconds and about 97 seconds, such as about 43 seconds. However, any suitable process conditions may be utilized.

With the presence of the third precursor material and the neutral radicals from the plasma of the first precursor material, these precursors will react with the material of the protection layer 406 (e.g., silicon) and will work to remove the remaining material of the protection layer 406. As such, the protection layer 406 may be removed from covering the first metal material layer 405.

Additionally, in an embodiment, the reaction of the material of the protection layer 406 with the precursors does not only remove the material of the protection layer 406. In addition, in an embodiment in which the protection layer 406 is silicon, the first precursor material is NF$_3$ and the third precursor material is hydrogen, the reaction will also form a solid by-product material 701 in a side reaction at the same time that the reaction is removing the material of the protection layer 406. In one such embodiment the solid by-product material 701 may be a by-product such as ammonium bifluoride (NH$_4$HF$_2$), and may be created (starting with an intermediate product) according to the reaction illustrated in Equation 1.

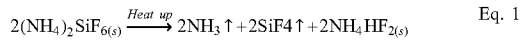

$$2(NH_4)_2SiF_{6(s)} \xrightarrow{Heat\ up} 2NH_3 \uparrow + 2SiF4 \uparrow + 2NH_4HF_{2(s)} \quad \text{Eq. 1}$$

However, any suitable material that is a by-product and can be used to protect the underlying layers may be utilized.

By depositing the solid by-product material 701, the solid by-product material 701 can protect the underlying layers (e.g., the first metal material layer 405) from undesired damage during the removal of the protection layer 406. As such, process challenges such as metal gate extrusion and damage to the top of the fin, which may be susceptible to such damage, can be minimized or reduced during the removal of the remainder of the protection layer 406.

FIG. 7C illustrates another cross-sectional view of the semiconductor device 100 after the removal of the protection layer 406. In this view, it can be seen that the first metal material layer 405 retains its thickness over the top of the fin 107 instead of being reduced in thickness through the etching process. In particular, after the removal of the protection layer 406, the first metal material layer 405 over the top of the fins 107 may have a first thickness T$_1$ of between about 5A and about 60A, such as about 15A, while the first metal material layer 405 along the sidewalls of the fins 107 may have a second thickness T$_2$ that is less than the first thickness T$_1$, such as being between about 5A and about 60A, such as about 15A.

As such, the first metal material layer 405 remains continuous after the removal of the protection layer 406. In particular, the process may increase the thickness that remains after the etching process (as compared to previous processes) of about 1.5 nm. Similarly, the removal of material of the first metal material layer 405 is improved by about 30% when compared to previous removal processes.

Figure 8:
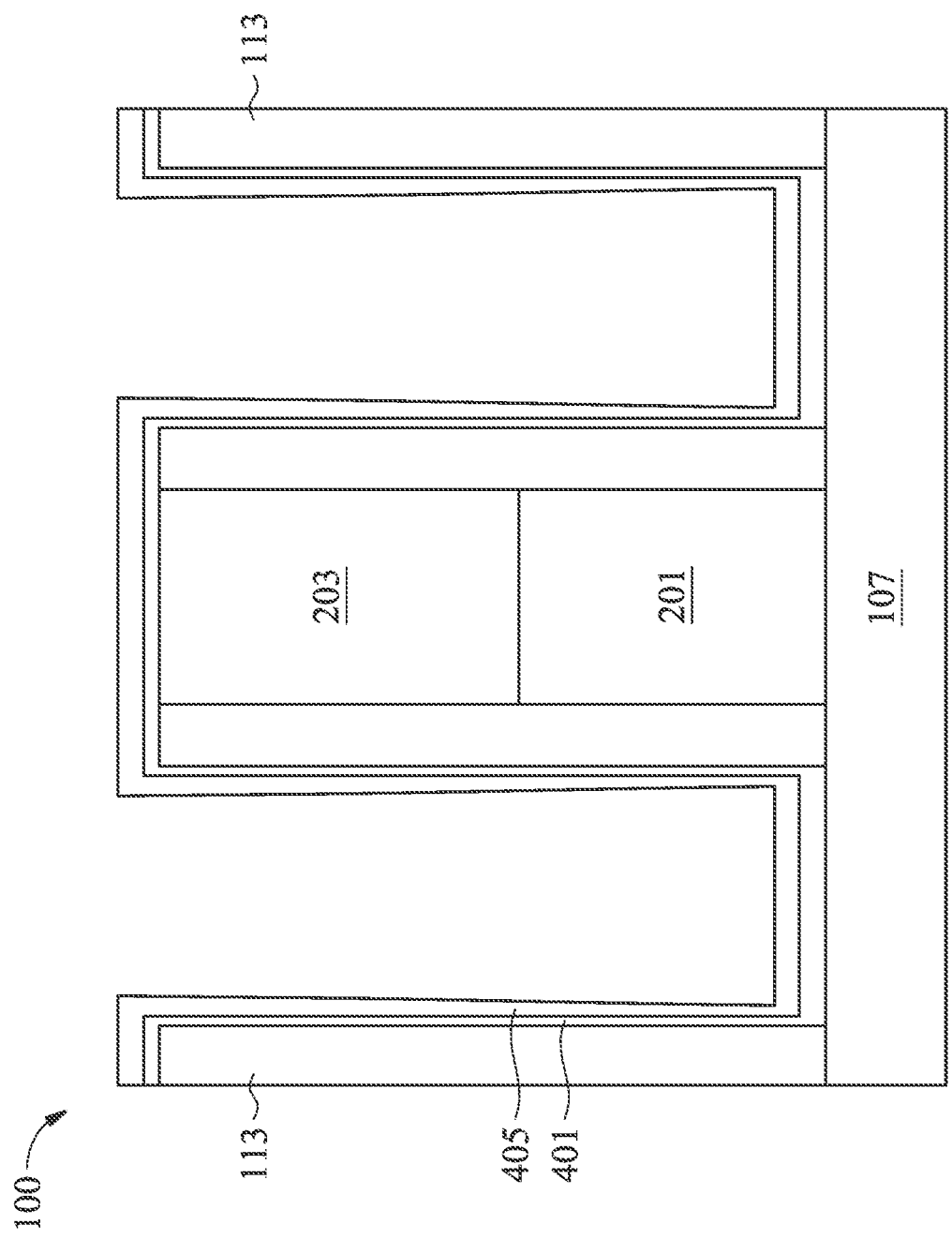
FIG. 8 illustrates a removal of a solid by-product material in accordance with some embodiments.

FIG. 8 illustrates that, once the protection layer 406 has been removed and the etching process has been finished, the solid by-product material 701 may be removed. In an embodiment the solid by-product material 701 may be removed by simply raising the temperature of the solid by-product material 701 above the triple point of the material of the solid by-product material 701. As such, in an embodiment in which the solid by-product material 701 is ammonium bifluoride, the solid by-product material 701 may be removed by raising the temperature of the ammonium bifluoride above 125° C. while at a pressure of about 40 Torr. However, any suitable temperature and pressure may be utilized.

In another embodiment, instead of utilizing the triple point of the material of the solid by-product material 701 to cause the solid by-product material 701 to sublimate, a chemical removal process may be utilized. In such an embodiment a wet etch or a dry etch process which utilizes etchants that are selective to the material of the solid by-product material 701 may be utilized to remove the solid by-product material 701. However, any suitable removal process may be utilized.

By utilizing the neutral radical etch along with the solid by-product material 701 as protection, damage and defects can be avoided. In some embodiments, the device formed can see an 10 Vdb improvement of about 2V, while an time-dependent gate oxide breakdown (nTDDB) can have an enhancement of +17 mV with no appreciable degradation in time to breakdown. Similarly, the number of defects on a wafer can be reduced from about 1343 (as a baseline number) to 1110 (using a $NF_3:H_2$ ratio of 0.5% for 43 seconds at a pressure of 2 Torr and a temperature of 40° C.) or even 530 (using a $NF_3:H_2$ ratio of 1.1% for 30 seconds at a pressure of 1 Torr and a temperature of 40° C.). Additionally, n-type devices can see a 0.56% improvement in the threshold voltage (NSVT) utilizing the embodiments described herein.

Figure 9:
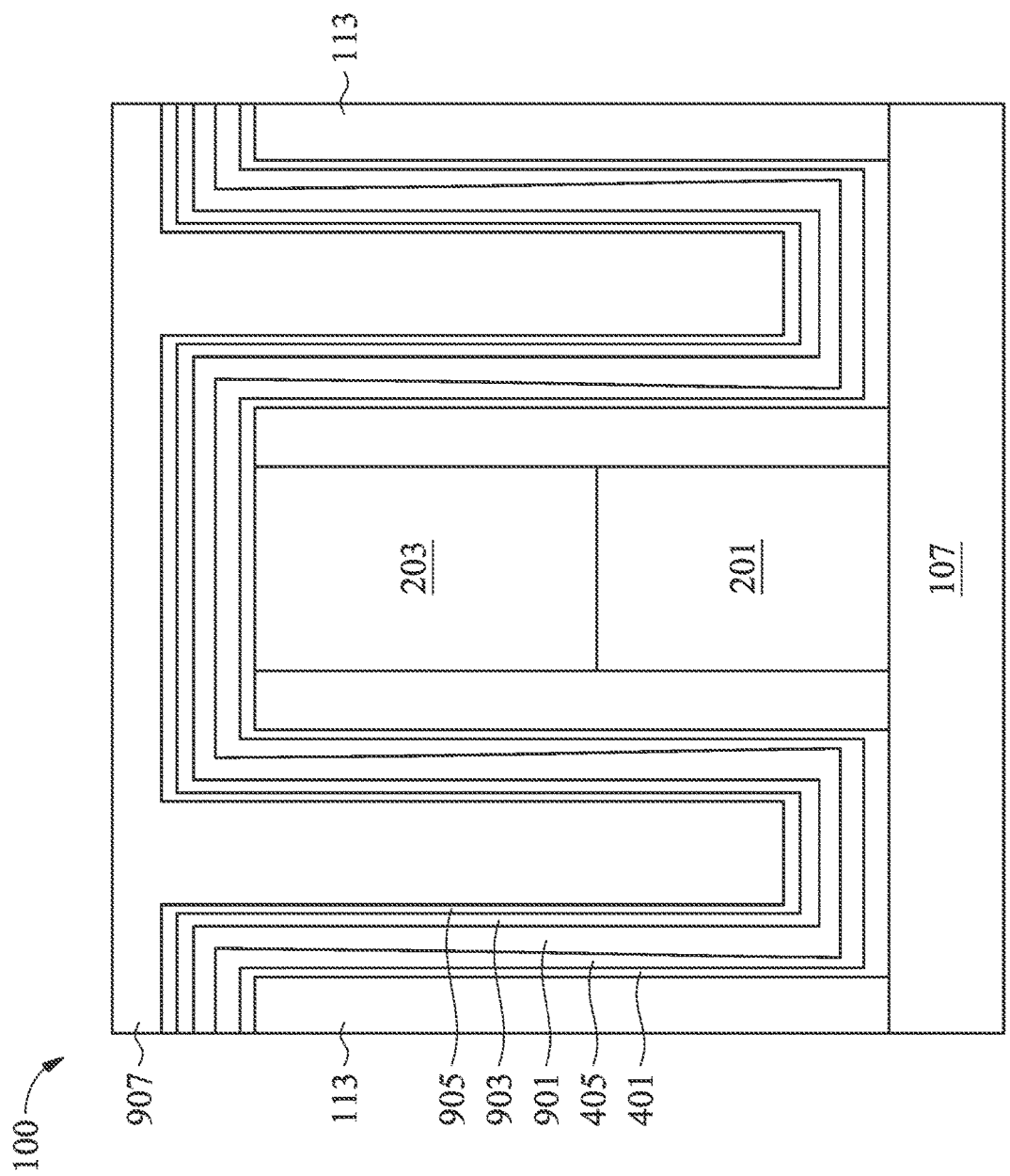
FIG. 9 illustrates a formation of a remainder of a gate stack in accordance with some embodiments.

FIG. 9 illustrates a formation of a work function layer 901 over the first metal material layer 405. The work function layer 901 may be chosen based upon the type of device desired. Exemplary p-type work function metals that may be included include Al, TiAlC, TiN, TaN, Ru, Mo, WN, $ZrSi_2$, $MoSi_2$, $TaSi_2$, $NiSi_2$, WN, other suitable p-type work function materials, or combinations thereof. Exemplary n-type work function metals that may be included include Ti, Ag, TaAl, TaAlC, TiAlN, TaC, TaCN, TaSiN, Mn, Zr, other suitable n-type work function materials, or combinations thereof. A work function value is associated with the material composition of the work function layer 901, and thus, the material of the work function layer 901 is chosen to tune its work function value so that a desired threshold voltage Vt is achieved in the device that is to be formed in the respective region. The work function layer(s) may be deposited by CVD, PVD, and/or other suitable process to a thickness of between about 5 Å and about 50 Å.

A metal layer 903 may be formed over the work function layer 901. In an embodiment the metal layer 903 may be a material that is both suitable for use as a seed layer to help a subsequent filling process as well as a material that can be used to help block or reduce the transport of fluorine atoms into the work function layer 901. In a particular embodiment, the metal layer 903 may be crystalline tungsten (W) that is formed free from the presence of fluorine atoms and formed using a process such as atomic layer deposition or chemical vapor deposition which utilizes precursor free from fluorine. However, any suitable material and method of formation may be utilized.

A nucleation layer 905 may be formed over the metal layer 903 in order to provide a nucleation point for a subsequent fill material 907. In an embodiment the nucleation layer 905 may be the same material as the metal layer 903 (e.g., tungsten), may be formed using a similar process (e.g., ALD), but may be deposited without fluorine free precursors. Additionally, while the metal layer 903 may be a crystalline (e.g., crystalline tungsten), the nucleation layer 905 may be formed to be an amorphous material, such as amorphous tungsten.

Once the nucleation layer 905 has been formed, a fill material 907 is deposited to fill a remainder of the opening using the nucleation layer 905 to help nucleate the fill material 907. In an embodiment the fill material 907 may be the same material as the nucleation layer 905 (e.g., tungsten) or may be a different material, such as Al, Cu, AlCu, W, Ti, TiAlN, TaC, TaCN, TaSiN, Mn, Zr, TiN, Ta, TaN, Co, Ni, combinations of these, or the like, to a thickness of between about 1000 Å and about 2000 Å, such as about 1500 Å. However, any suitable material may be utilized.

Additionally, the fill material 907 may be deposited using a deposition process such as a non-conformal deposition process such as chemical vapor deposition. In an embodiment the deposition process may utilize precursors such as tungsten fluoride ($WF_6$) and hydrogen ($H_2$), although any suitable precursors may be utilized. In a particular embodiment using tungsten fluoride and hydrogen as the precursors, the tungsten fluoride may be flowed into a reaction chamber at a flow rate of between about 0.1 slm and about 0.5 slm, such as about 0.3 slm, while the hydrogen may be flowed in at the same time at a flow rate of between about 1 slm and about 10 slm, such as about 6 slm. Additionally, the chemical vapor deposition process may be performed at a temperature of between about 200° C. and about 400° C., such as about 300° C., and at a pressure of between about 100 torr and about 400 torr, such as about 250 torr. However, any suitable process conditions may be utilized.

Figure 10:
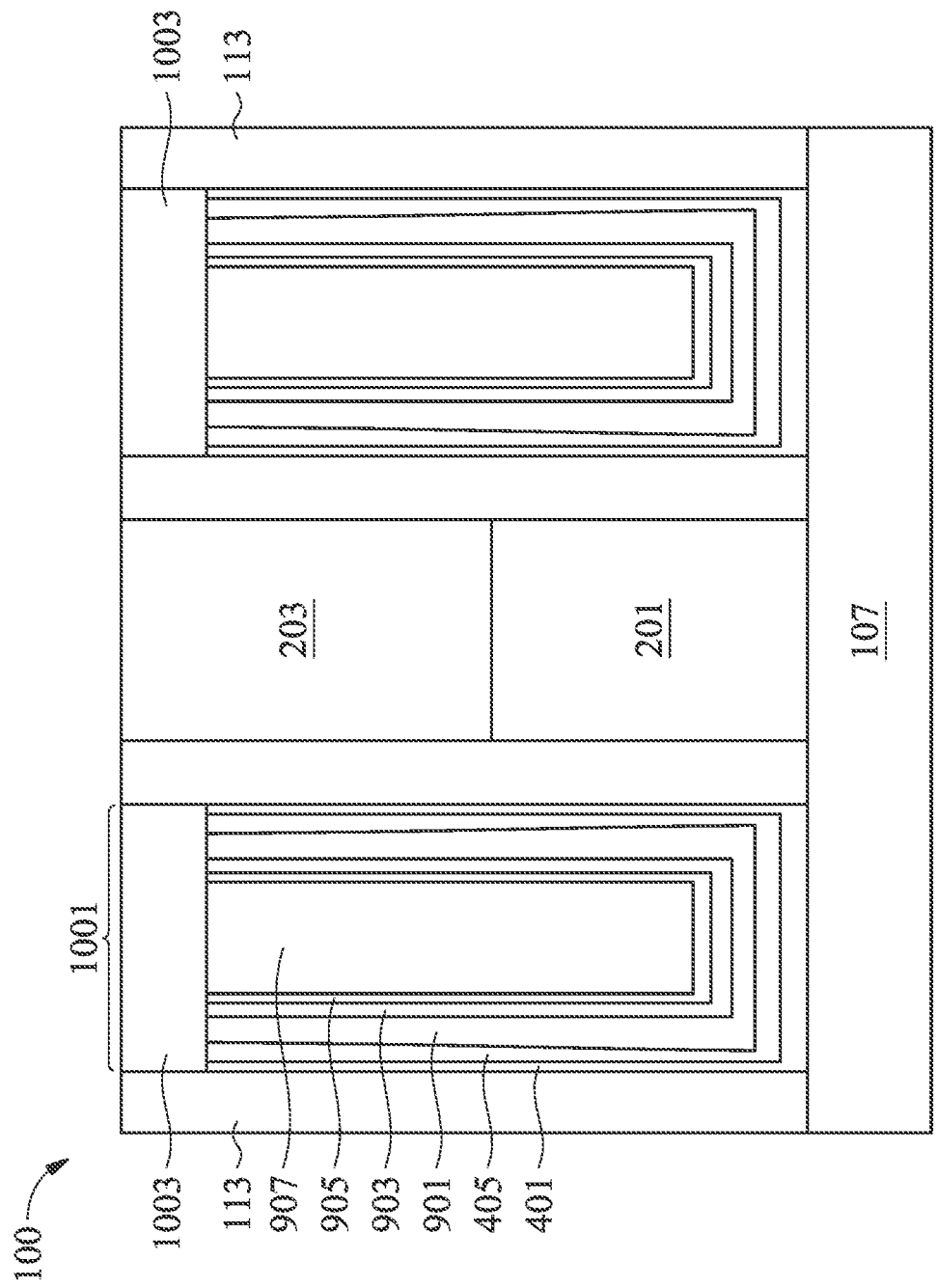
FIG. 10 illustrates a formation of a capping layer in accordance with some embodiments.

FIG. 10 illustrates that, after the fill material 907 has been deposited to fill and overfill the opening, any excess material outside of the opening may be planarized to form the gate stack 1001. In an embodiment the materials may be planarized with the first spacers 113 using, e.g., a chemical mechanical polishing process, although any suitable process, such as grinding or etching, may be utilized.

After the materials of the gate stack 1001 have been formed and planarized, the materials of the gate stack 1001 may be recessed and capped with a capping layer 1003. In an embodiment the materials of the gate stack 1001 may be recessed using, e.g., a wet or dry etching process that utilizes etchants selective to the materials of the gate stack 1001. In an embodiment the materials of the gate stack 1001 may be recessed a distance of between about 5 nm and about 150 nm, such as about 120 nm. However, any suitable process and distance may be utilized.

Once the materials of the gate stack 1001 have been recessed, the capping layer 1003 may be deposited and planarized with the first spacers 113. In an embodiment the capping layer 1003 is a material such as SiN, SiON, SiCON, SiC, SiOC, combinations of these, or the like, deposited using a deposition process such as atomic layer deposition, chemical vapor deposition, sputtering, or the like. The capping layer 1003 may be deposited to a thickness of between about 5 Å and about 200 Å, and then planarized using a planarization process such as chemical mechanical polishing such that the capping layer 1003 is planar with the first spacers 113.

After the capping layer 1003 has been formed, additional processing may be performed. For example, a source/drain contact (not separately illustrated in FIG. 10) may be formed to make electrical connection to the source/drain region, and a gate contact (also not separately illustrated in FIG. 10) may also be formed through the capping layer 1003 in order to make electrical connection to the gate stack 1001. Further, metallization layers may be formed in contact with the source/drain contact and the gate contact in order to provide routing and functionality to the device. Any suitable further processing may be utilized.

By utilizing the embodiments described herein, surface damage to the devices formed which can cause the voltage breakdown to grow worse by about 2.0 V can be mitigated or eliminated, allowing for a better overall process window (e.g. a reduction of the limit of line-end by about 2 nm). This is especially true with high aspect ratios and rough surfaces.

In accordance with an embodiment, a method of manufacturing a semiconductor device includes forming an etching plasma from a first precursor material; separating neutral radicals of the etching plasma; and exposing surfaces of a protective layer over a gate dielectric to the neutral radicals of the etching plasma and a second precursor material to etch portions of the surfaces of the protective layer, the second precursor material not being a plasma. In an embodiment the method further includes performing an annealing process on the gate dielectric, wherein the annealing process oxidizes a portion of the protection layer to form an oxidized portion, the annealing process being performed before the forming the etching plasma; forming an oxide etching plasma from the first precursor material and a third precursor material, the third precursor material being different from the first precursor material and the second precursor material; and using the oxide etching plasma to remove the oxidized portion. In an embodiment the first precursor material is nitrogen trifluoride, the second precursor material is hydrogen, and the third precursor material is ammonia. In an embodiment the separating the neutral radicals of the etching plasma comprises activating a filter that prevents positive ions and negative ions of the etching plasma from passing through the filter. In an embodiment the exposing the surfaces of the protective layer is performed at a temperature at or below 100° C. while at a pressure of less than or equal to 5 Torr. In an embodiment the protective layer is silicon. In an embodiment the exposing the surfaces of the protective layer further deposits a solid by-product material.

In accordance with another embodiment, a method of manufacturing a semiconductor device includes depositing a first dielectric layer over a channel region of a semiconductor fin; forming a first metal barrier layer over the first dielectric layer; forming a protective layer over the first metal barrier layer; performing an annealing process, wherein the annealing process oxidizes a portion of the protection layer to form an oxidized portion; using a plasma etching process to remove the oxidized portion; and after the using the plasma etching process, using a radical plasma etching process to remove the protection layer, wherein the radical plasma etching process includes forming a first plasma from a first precursor; activating a filter to separate neutral radicals from positive radicals and negative radicals; sending the neutral radicals to an etching chamber; and introducing a non-plasma precursor into the etching chamber with the neutral radicals. In an embodiment the radical plasma etching process produces a solid by-product layer. In an embodiment the method further includes removing the solid by-product layer after the radical plasma etching process. In an embodiment the removing the solid by-product layer is performed at least in part through a sublimation process. In an embodiment the solid by-product layer comprises ammonium bifluoride. In an embodiment the first precursor is nitrogen trifluoride and the non-plasma precursor is hydrogen. In an embodiment the plasma etching process includes forming the first plasma from the first precursor; forming a second plasma from a second precursor; and introducing the first plasma and the second plasma to the oxidized portion.

In accordance with yet another embodiment, a method of manufacturing a semiconductor device includes removing a dummy gate from over a semiconductor fin; depositing a barrier layer over the semiconductor fin; depositing silicon over the barrier layer; oxidizing a portion of the silicon to form a layer of silicon oxide and a remaining portion of the silicon; removing the layer of silicon oxide; reacting the remaining portion of the silicon, wherein the reacting the remaining portion of the silicon both removes the silicon as well as deposits a solid protective material; and removing the solid protective material. In an embodiment the solid protective material comprises ammonium bifluoride. In an embodiment the removing the solid protective material comprises sublimating the solid protective material. In an embodiment the reacting the remaining portion of the silicon comprises introducing neutral radicals from a first precursor material. In an embodiment the neutral radicals pass through an activated filter prior to reacting with the remaining portion of the silicon. In an embodiment the removing the layer of silicon oxide comprises introducing neutral radicals, positive radicals, and negative radicals from the first precursor material.

In accordance with yet another embodiment, a method of manufacturing a semiconductor device includes forming a layer of silicon oxide over a barrier layer, the barrier layer being on a semiconductor fin, and removing the layer of silicon oxide. Removing the layer of silicon oxide includes separating neutral radicals from an etching plasma and exposing the layer of silicon oxide to the neutral radicals, wherein the exposing the layer of silicon oxide to the neutral radicals forms a solid protective material over the barrier layer.

In accordance with yet another embodiment, a method of manufacturing a semiconductor device includes: forming a barrier layer over a semiconductor fin, depositing a silicon layer over the barrier layer, forming a layer of silicon oxide by annealing a portion of the silicon layer, and removing the layer of silicon oxide and a remaining portion of the silicon layer with a plasma process. The plasma process includes: forming a first plasma from a first precursor, separating neutral radicals of the first plasma from positive radicals of the first plasma and negative radicals of the first plasma, and delivering the neutral radicals to the layer of silicon oxide and the remaining portion of the silicon layer.

In accordance with yet another embodiment, a method of manufacturing a semiconductor device includes depositing a barrier layer over sidewalls and a bottom surface of an opening over a channel region of a semiconductor fin and forming a solid protective material over the barrier layer. The forming the solid protective material includes etching a protective layer over the barrier layer with a radical plasma etch. The solid protective material is formed during the radical plasma etch. The radical plasma etch includes introducing a non-plasma precursor into an etching chamber, and sending neutral radicals of a first plasma to the etching chamber. The sending the neutral radicals to the etching chamber includes activating a filter to separate the neutral radicals from charged radicals of the first plasma, removing the solid protective material, and filling the opening with a gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a layer of silicon oxide over a barrier layer, the barrier layer being on a semiconductor fin; and
   removing the layer of silicon oxide, comprising:
      separating neutral radicals from an etching plasma; and
      exposing the layer of silicon oxide to the neutral radicals, wherein the exposing the layer of silicon oxide to the neutral radicals forms a solid protective material over the barrier layer.

2. The method of claim 1, wherein the separating the neutral radicals from the etching plasma is performed with an electrically charged grating.

3. The method of claim 1, wherein the etching plasma is formed using $NF_3$ as a precursor.

4. The method of claim 1, wherein the etching plasma is formed using a precursor comprising hydrogen.

5. The method of claim 1, wherein the solid protective material is ammonium bifluoride.

6. The method of claim 1, further comprising removing the solid protective material by raising a temperature of the solid protective material above a triple point of a material of the solid protective material.

7. A method of manufacturing a semiconductor device, the method comprising:
   forming a barrier layer over a semiconductor fin;
   depositing a silicon layer over the barrier layer;
   forming a layer of silicon oxide by annealing a portion of the silicon layer; and
   removing the layer of silicon oxide and a remaining portion of the silicon layer with a plasma process, wherein the plasma process comprises:
      forming a first plasma from a first precursor;
      separating neutral radicals of the first plasma from positive radicals of the first plasma and negative radicals of the first plasma; and
      delivering the neutral radicals to the layer of silicon oxide and the remaining portion of the silicon layer.

8. The method of claim 7, wherein the plasma process further comprises forming a second plasma from a second precursor.

9. The method of claim 8, wherein the first precursor is $NF_3$ and the second precursor is $NH_3$.

10. The method of claim 7, wherein the plasma process further comprises generating the first plasma with a pulse of electricity in a range of 10 kHz and 30 MHz.

11. The method of claim 7, wherein the separating the neutral radicals of the first plasma from the positive radicals of the first plasma and the negative radicals of the first plasma is performed with an electrically charged grating.

12. The method of claim 7, wherein the delivering the neutral radicals to the layer of silicon oxide and the remaining portion of the silicon layer is performed at a pressure less than 5 Torr.

13. The method of claim 7, wherein the delivering the neutral radicals to the layer of silicon oxide and the remaining portion of the silicon layer is performed at a temperature in a range of 30° C. and 100° C.

14. The method of claim 7, wherein the delivering the neutral radicals to the layer of silicon oxide and the remaining portion of the silicon layer is performed for a time in a range of 30 seconds and 97 seconds.

15. A method of manufacturing a semiconductor device, the method comprising:
   depositing a barrier layer over sidewalls and a bottom surface of an opening over a channel region of a semiconductor fin;
   forming a solid protective material over the barrier layer, the forming the solid protective material comprising:
      etching a protective layer over the barrier layer with a radical plasma etch, the solid protective material being formed during the radical plasma etch, wherein the radical plasma etch comprises:
         introducing a non-plasma precursor into an etching chamber; and
         sending neutral radicals of a first plasma to the etching chamber, the sending the neutral radicals to the etching chamber comprising activating a filter to separate the neutral radicals from charged radicals of the first plasma;
   removing the solid protective material; and
   filling the opening with a gate stack.

16. The method of claim 15, further comprising annealing a top portion of the protective layer to form an oxide layer.

17. The method of claim 16, wherein the radical plasma etch removes the oxide layer and a remaining portion of the protective layer.

18. The method of claim 15, wherein the protective layer is silicon.

19. The method of claim 15, wherein the solid protective material is formed in a reaction between fluorine from the first plasma and hydrogen from the non-plasma precursor.

20. The method of claim 19, wherein the solid protective material comprises nitrogen, hydrogen, and fluorine.

* * * * *